(12) United States Patent
Lu

(10) Patent No.: US 6,488,392 B1
(45) Date of Patent: Dec. 3, 2002

(54) LED DIFFUSION ASSEMBLY

(76) Inventor: Clive S. Lu, 282 Newbridge Rd., Hicksville, NY (US) 11801

(*) Notice: Subject to any disclaimer, the term of this patent is extended or adjusted under 35 U.S.C. 154(b) by 0 days.

(21) Appl. No.: 09/880,046

(22) Filed: Jun. 14, 2001

(51) Int. Cl.$^7$ .................................................. F21V 5/02
(52) U.S. Cl. ........................ 362/308; 362/800; 362/339; 313/512; 257/98
(58) Field of Search .................... 313/500, 512; 257/98, 99; 362/800, 244, 246, 236, 235, 227, 308, 309, 339

(56) References Cited

U.S. PATENT DOCUMENTS

| | | | |
|---|---|---|---|
| 3,774,021 A | * 11/1973 | Johnson ........................ 362/27 |
| 5,126,929 A | 1/1992 | Cheselske ................... 362/363 |
| 5,440,468 A | 8/1995 | Savage, Jr. .................. 362/226 |
| 5,567,037 A | * 10/1996 | Ferber ......................... 362/104 |
| 5,594,433 A | 1/1997 | Terlep ....................... 340/908.1 |
| 5,608,290 A | 3/1997 | Hutchisson et al. ..... 315/200 A |
| 5,633,623 A | 5/1997 | Campman ................... 340/321 |
| 5,704,709 A | 1/1998 | Zwick et al. ................ 362/304 |
| 5,765,940 A | 6/1998 | Levy et al. .................. 362/240 |
| 5,848,839 A | 12/1998 | Savage, Jr. .................. 362/267 |
| 5,865,529 A | * 2/1999 | Yan .............................. 362/327 |
| 5,876,109 A | 3/1999 | Scalco ......................... 362/104 |
| 5,893,633 A | 4/1999 | Uchio et al. ................ 362/244 |
| 5,894,195 A | 4/1999 | McDermott ................. 313/512 |
| 5,931,570 A | 8/1999 | Yamuro ....................... 362/355 |

* cited by examiner

Primary Examiner—Alan Cariaso
Assistant Examiner—Sharon Payne
(74) Attorney, Agent, or Firm—Welsh & Flaxman LLC

(57) ABSTRACT

An LED diffusion assembly having a concave tip portion shaped and dimensioned for the diffusion of light emitted thereby. The assembly includes a bulb portion and first and second leads extending within the bulb shaped portion. The assembly also includes LED dice embedded in the bulb shaped portion and coupled to the first and second leads in a manner allowing for transfer of electrical energy to the LED dice. The bulb portion includes a concave tip substantially opposite the LED dice, wherein the concave tip is shaped and dimensioned for diffusing light emitted by the LED dice.

10 Claims, 3 Drawing Sheets

FIG.2
FIG.3
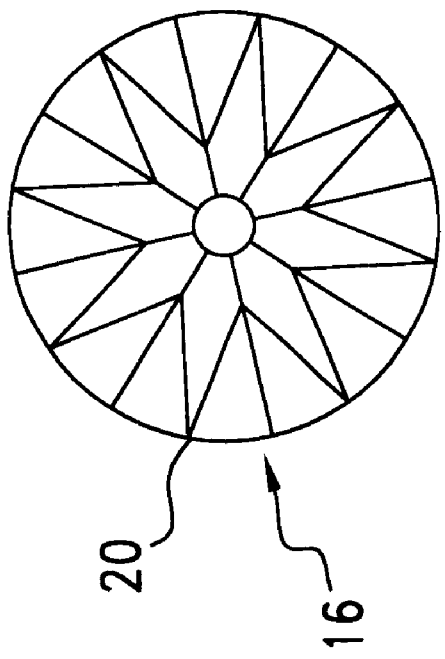
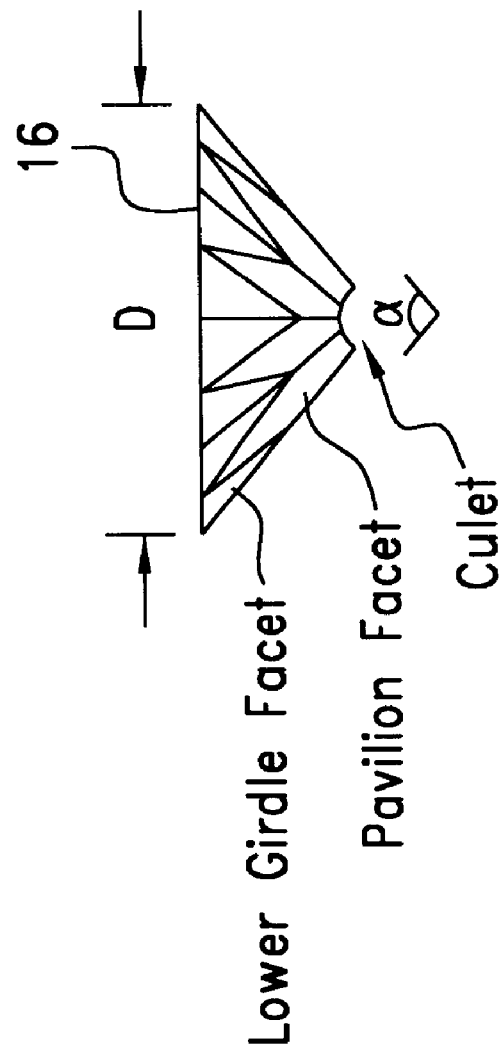

LED DIFFUSION ASSEMBLY

BACKGROUND OF THE INVENTION

1. Field of the Invention

The invention relates to an LED lamp. More particularly, the invention relates to an LED diffusion assembly for use in various LED applications where diffusion of the emitted light is desired.

2. Description of the Prior Art

As the ability to effectively diffuse the light emitted by an LED becomes more efficient, their usefulness in various applications similarly increases. For example, LEDs are now commonly found in automobile tail lights and commercial signs. The use of LEDs in these applications results in the replacement of larger more expensive light sources with smaller, high output light sources without sacrificing the desired illumination levels.

As such, a need continually exists for LED diffusion arrangements offering improved and efficient dispersion of light generated by LEDs. The present invention provides such an LED diffusion assembly.

SUMMARY OF THE INVENTION

It is, therefore, an object of the present invention to provide an LED diffusion assembly having a concave tip portion shaped and dimensioned for the diffusion of light emitted thereby. The assembly includes a bulb portion and first and second leads extending within the bulb portion. The assembly also includes LED dice embedded in the bulb portion and coupled to the first and second leads in a manner allowing for transfer of electrical energy to the LED dice. The bulb portion includes a concave tip substantially opposite the LED dice, wherein the concave tip is shaped and dimensioned for diffusing light emitted by the LED dice.

It is also an object of the present invention to provide an LED diffusion assembly wherein the bulb portion is formed from an epoxy resin.

It is another object of the present invention to provide an LED diffusion assembly wherein the bulb portion is formed from glass.

It is a further object of the present invention to provide an LED diffusion assembly wherein a first end of the first lead is embedded within the bulb portion and coupled to the LED dice and a first end of the second lead is embedded within the bulb portion and coupled to the LED dice.

It is still another object of the present invention to provide an LED diffusion assembly wherein the concave tip includes a plurality of facets.

It is still a further object of the present invention to provide an LED diffusion assembly wherein the concave tip includes a diameter D, a height H and a concave angle $\alpha$.

It is also an object of the present invention to provide an LED diffusion assembly wherein $\alpha$ is preferably approximately between 85 degrees and 170 degrees.

It is another object of the present invention to provide an LED diffusion assembly wherein D is greater than approximately 2 mm.

It is a further object of the present invention to provide an LED diffusion assembly wherein H/D is less than approximately 58%.

It is also an object of the present invention to provide an LED diffusion assembly wherein the minimum Culer convex radius is approximately 1 mm.

It is yet another object of the present invention to provide an LED diffusion assembly wherein the concave tip is shaped as a diamond pavilion having a diameter D, a height H and a concave angle $\alpha$.

It is a further object of the present invention to provide an LED diffusion assembly wherein $\alpha$ is preferably approximately between 85 degrees and 170 degrees.

It is also an object of the present invention to provide an LED diffusion assembly wherein the bulb portion is formed as a composite.

Other objects and advantages of the present invention will become apparent from the following detailed description when viewed in conjunction with the accompanying drawings, which set forth certain embodiments of the invention.

BRIEF DESCRIPTION OF THE DRAWINGS

FIG. 2 is a top view of the concave tip in accordance with the present invention.

FIG. 3 is cross sectional view of the concave tip in accordance with the present invention.

DESCRIPTION OF THE PREFERRED EMBODIMENTS

The detailed embodiments of the present invention are disclosed herein. It should be understood, however, that the disclosed embodiments are merely exemplary of the invention, which may be embodied in various forms. Therefore, the details disclosed herein are not to be interpreted as limited, but merely as the basis for the claims and as a basis for teaching one skilled in the art how to make and/or use the invention.

Figure 1:
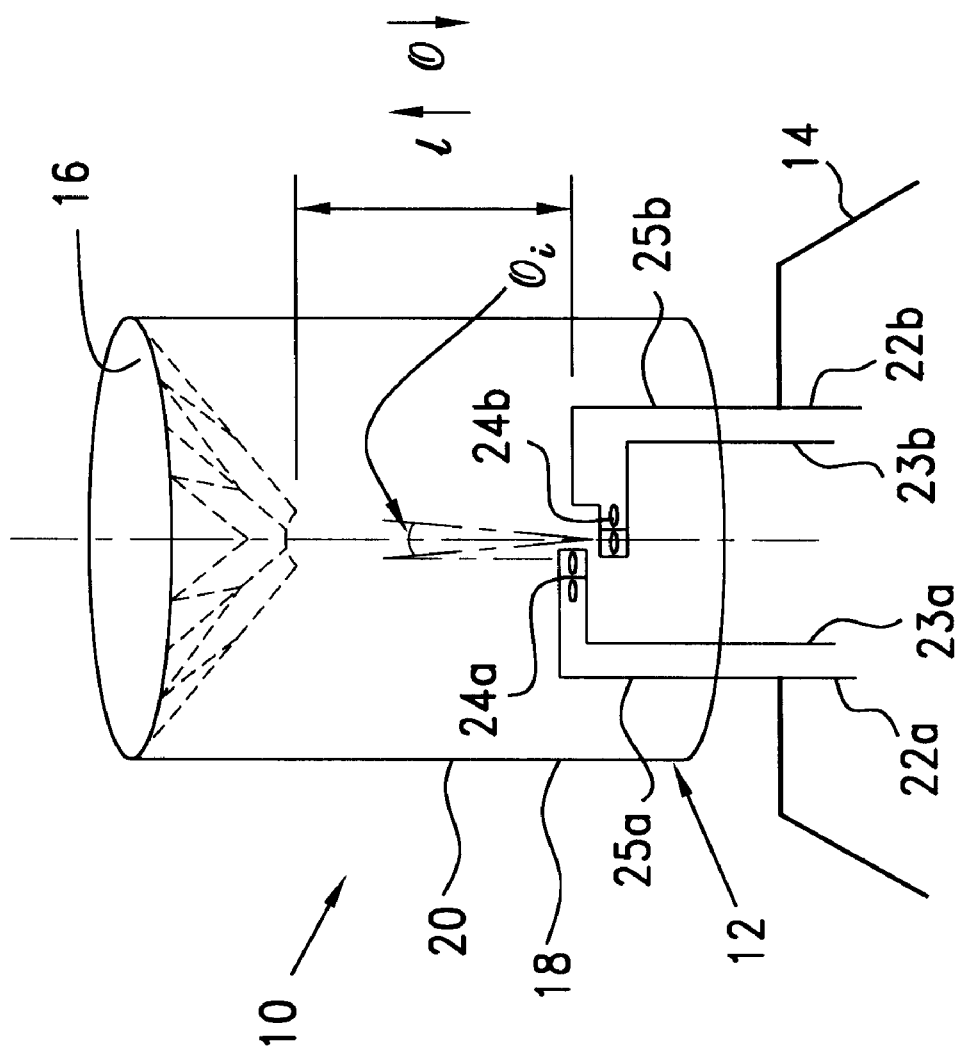
FIG. 1 is a perspective view of an LED diffusion assembly in accordance with the present invention.

With reference to FIG. 1, an LED diffusion assembly 10 is disclosed. The LED diffusion assembly 10 is generally composed of an LED lamp 12 mounted within a socket 14. The LED lamp 12 has a concave tip portion 16 shaped and dimensioned for the diffusion of light emitted thereby.

The LED lamp 12 generally includes a bulb portion 18. While a specific shaped bulb portion is contemplated in accordance with a preferred embodiment of the present invention, other shapes may be used without departing from the spirit of the present invention. The bulb portion 18 is generally formed from epoxy resin, or any other appropriate resin or glass known to those of skill in the art. Similarly, a composite material may be used in accordance with the present invention. Such a composite material would be formed from different materials in layers, or some other form, through the use of adhesive, fusion, brazing, etc.

The bulb portion 18 includes generally smooth sides 20 with a concave tip portion 16. The concave tip portion 16 will be discussed below in greater detail. The side surfaces of the bulb portion 18 may be treated in various ways know to those skilled in the art to provide desired illumination. With the exception of the concave tip portion 16 discussed below in substantial detail, the manner in which the bulb portion 18 is treated is not critical and may be readily varied to suit specific needs without departing from the spirit of the present invention.

The LED lamp 12 further includes a pair of leads 22a, 22b. One end 23a, 23b of each lead 22a, 22b extends outside of the bulb portion 18 and the other end 25a, 25b of each lead is embedded in the bulb portion 18. Finally, the LED lamp 12 includes a pair of LED chips (dice) 24a, 24b respectively connected to the ends 25a, 25b of the first and second leads 22a, 22b embedded in the bulb portion 18. The LED dice 24a, 24b are connected to the first and second leads 22a, 22b using conventional techniques in such a manner that electrical power may be selectively supplied to the LED dice 24a, 24b.

The present LED lamp 12 is provided with at least one LED dice for emitting light of appropriate color (wavelength). While a preferred embodiment discloses an LED lamp using a pair of LED dice, those skilled in the art will appreciate the fact that the LED lamp may use one or more LED dice without departing from the spirit of the present invention. For example, an LED emitting a requested color of light can be obtained by appropriately arranging a plurality of red, green, and blue LED dice. In accordance with a preferred embodiment of the present invention, the diameter of the bulb portion is approximately 3 mm through 10 mm, though obviously, the diameter can be larger or smaller than these values without departing from the spirit of the present invention.

Referring to the concave tip portion 16 of the LED lamp 12 disclosed in FIGS. 2 and 3, it is generally formed in such a way to diffuse light as it is emitted from the LED dice 24a, 24b. In accordance with a preferred embodiment as disclosed in FIGS. 2 and 3, the concave tip portion 16 generally takes the form a diamond pavilion having a diameter D, a height H and a concave angle α. Based upon the facets of the diamond pavilion defining the concave tip portion 16 of the LED lamp 12, light emitted by the LED dice 24a, 24b, and traveling within the epoxying making up the bulb shaped portion 18, is deflected at a greater rate than the same light traveling through air. As such, when the light emitted by the LED dice 24a, 24b exits the epoxy of the bulb shaped portion 18, the light bends away into the air.

In accordance with the preferred embodiment described above, α is preferably approximately between 85 degrees and 170 degrees. In addition, D is greater than approximately 2 mm and the depth (i.e., H/D) is less than approximately 58%. Finally, the minimum Culer convex radius is approximately 1 mm. While these ranges are given in accordance with a preferred embodiment, those skilled in the art will appreciate the possible variations within the spirit of the present invention.

Figure 5:
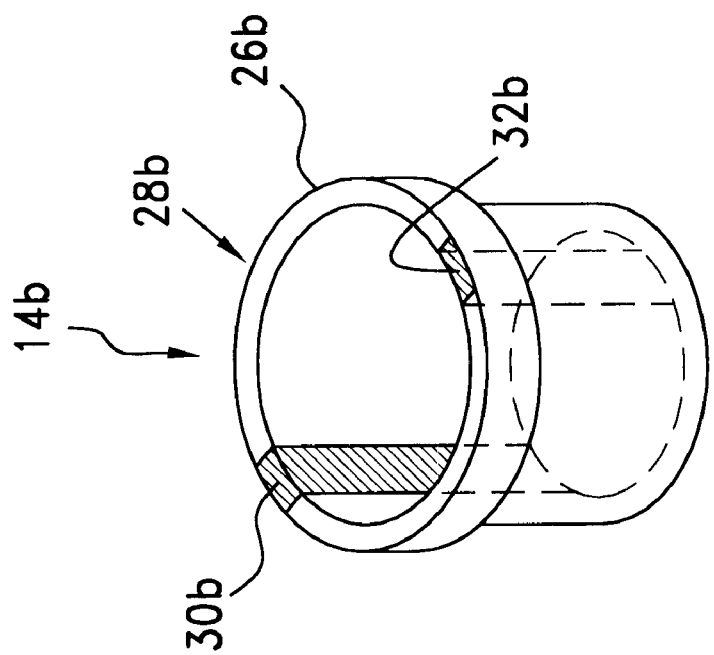
FIGS. 4 and 5 are perspective views of sockets which may be used in accordance with the present invention.
Figure 4:
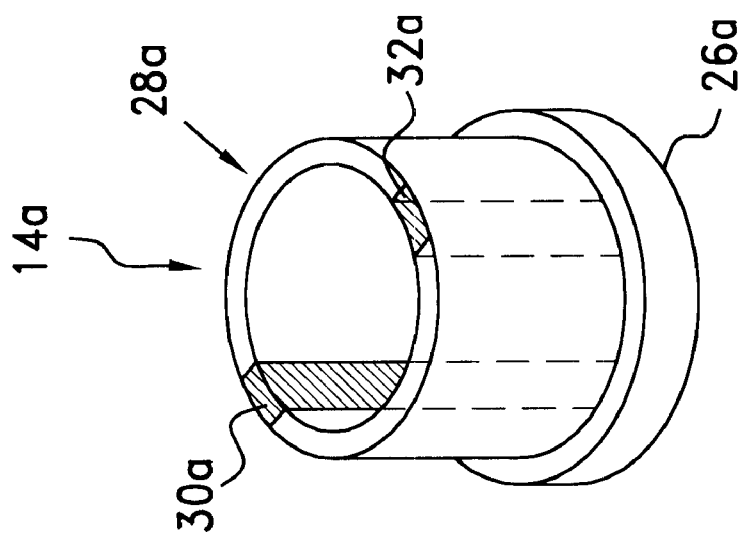

Various sockets 14a, 14b which may be used in accordance with present LED lamp 12 are disclosed in FIGS. 4 to 5. Each of the circular sockets 14a, 14b repeatedly comprises a flange 26a, 26b provided at the top or bottom of the socket 14a, 14b, an insulating material 28a, 28b incorporated into the flange 26a, 26b, and two opposing electrodes 30a,32a, 30b, 32b set inside the insulating material 28a, 28b as shown in FIGS. 4 and 5. The LED lamp 12 is inserted into the socket 14a, 14b, making a connection between the electrodes 30a, 32a, 30b,32b and the leads 22a, 22b. The two leads 22a, 22b extending downward from the base of the inserted LED lamp 12 are bent upward along the outside of the lamp 12. In this state, the lamp 12 is inserted into either socket 14a, 14b in such way that the two leads 22a, 22b respectively connect with the two electrodes 30a, 32a, 30b, 32b. These electrodes are connected to the power source (not shown) through an appropriate conductor. Thus, the socket 14a, 14b can be fixed to the power source, and only the LED lamp 12 can be optionally removed from the power source or exchanged.

By providing the present LED assembly 10 with a concave tip portion 16 having a plurality of facets cut therein, the present invention is capable of effectively diffusing the light generated by the LED dice 24a, 24b.

While the preferred embodiments have been shown and described, it will be understood that there is no intent to limit the invention by such disclosure, but rather, is intended to cover all modifications and alternate constructions falling within the spirit and scope of the invention as defined in the appended claims.

What is claimed is:

1. An LED diffusion assembly having a concave tip portion shaped and dimensioned for the diffusion of light emitted thereby, comprising:

a bulb portion;

first and second leads extending within the bulb portion; and at least one LED die embedded in the bulb portion and coupled to the first and second leads in a manner allowing for transfer of electrical energy to the at least one LED die;

wherein the bulb portion includes a concave tip substantially opposite the at least one LED die, the concave tip being shaped and dimensioned for diffusing light emitted by the at least one LED die, and wherein the concave tip takes the form of a diamond pavilion including a plurality of facets and having a diameter D, a height H and a concave angle a at a base of the concave tip which are so dimensioned such that light emitted by the at least one LED die bends away from the diffusion assembly into the air.

2. The LED diffusion assembly according to claim 1, wherein the bulb portion is formed from an epoxy resin.

3. The LED diffusion assembly according to claim 1, wherein the bulb portion is formed from glass.

4. The LED diffusion assembly according to claim 1, wherein a first end of the first lead is embedded within the bulb portion and coupled to the at least one LED die and a first end of the second lead is embedded within the bulb portion and coupled to the at least one LED die.

5. The LED diffusion assembly according to claim 1, wherein α is between approximately 85 degrees and 170 degrees.

6. The LED diffusion assembly according to claim 1, wherein D is greater than approximately 2 mm.

7. The LED diffusion assembly according to claim 1, wherein H/D is less than approximately 58%.

8. The LED diffusion assembly according to claim 1, wherein the concave tip includes a Culer convex radius and the minimum Culer convex radius is approximately 1 mm.

9. The LED diffusion assembly according to claim 1, wherein the bulb portion is formed as a composite of different materials.

10. The LED diffusion assembly according claim 1, wherein the at least one LED die consists of two LED dice.

* * * * *